United States Patent [19]

Holt

[11] 4,409,423
[45] Oct. 11, 1983

[54] HOLE MATRIX VERTICAL JUNCTION SOLAR CELL

[75] Inventor: James F. Holt, Medway, Ohio

[73] Assignee: The United States of America as represented by the Secretary of the Air Force, Washington, D.C.

[21] Appl. No.: 356,574

[22] Filed: Mar. 9, 1982

[51] Int. Cl.³ ............................................. H01L 31/06
[52] U.S. Cl. ..................................... 136/255; 357/20; 357/30
[58] Field of Search ...................... 136/255; 357/20, 30

[56] References Cited

U.S. PATENT DOCUMENTS

| | | | |
|---|---|---|---|
| 3,682,708 | 8/1972 | Bennett | 136/255 |
| 3,690,953 | 9/1972 | Wise | 136/255 |
| 3,985,579 | 10/1976 | Rahilly | 136/255 |
| 4,137,123 | 1/1979 | Bailey et al. | 156/647 |
| 4,147,564 | 4/1979 | Magee et al. | 148/1.5 |
| 4,160,045 | 7/1979 | Longshore | 427/38 |
| 4,227,942 | 10/1980 | Hall | 136/255 |
| 4,252,865 | 2/1981 | Gilbert et al. | 428/611 |

Primary Examiner—Aaron Weisstuch
Attorney, Agent, or Firm—Donald J. Singer; Bobby D. Scearce

[57] ABSTRACT

An improved vertical junction solar cell is provided which comprises a thin silicon chip having on one surface thereof a plurality of holes therein closely spaced in a desired array, the walls of the holes defining the vertical junction of the cell. The resulting structure provides improved light utilization during the entire life of the cell, and improved radiation resistance, as compared to grooved structure cells.

2 Claims, 3 Drawing Figures

HOLE MATRIX VERTICAL JUNCTION SOLAR CELL

RIGHTS OF THE GOVERNMENT

The invention described herein may be manufactured and used by or for the Government of the United States for all governmental purposes without the payment of any royalty.

BACKGROUND OF THE INVENTION

This invention relates generally to the field of solar cells, and more particularly to improvements in vertical junction solar cells.

The basic structure and operation of solar cells is well known, and the utilization of silicon solar cells for the generation of electricity for remote marine, terrestrial, and satellite applications is well documented. The development of the vertical junction solar cell answered the need for a radiation resistant cell having improved electrical conversion efficiency for operation in an ionizing radiation environment to which the cell may be subjected in extra-terrestrial applications. The state of the art relating to vertical junction solar cells may be exemplified by solar cell configurations disclosed by or referenced in U.S. Pat. No. 3,690,953 to Wise, entitled "Vertical Junction Hardened Solar Cell", and U.S. Pat. No. 3,985,579 to Rahilly, entitled "Rib and Channel Vertical Multijunction Solar Cell".

Vertical junction solar cells finding substantial prior use have structural fragility which has made them susceptible to failure when subjected to thermal cycling or to mechanical stresses within a power system. Existing vertical junction cell structure configurations comprise a plurality of narrow grooves or channels etched in the surface of a semiconductor substrate, the channels providing the areas upon which the photovoltaic junction of the cell is diffused. The narrow ribs of the existing cells are susceptible to fracture, severely limiting the reliability of the cells.

The present invention provides a novel vertical junction solar cell structure comprising a silicon chip having in one surface a plurality of holes closely spaced in an array to provide the vertical junction areas on the walls of the holes. This configuration substantially eliminates any rib fracture problem characteristic of grooved cells.

It is therefore an object of this invention to provide a more reliable radiation resistant silicon solar cell of improved efficiency.

It is a further object of this invention to provide a vertical junction solar cell having improved mechanical strength and light-absorbing characteristics.

These and other objects of the present invention will become apparent as the detailed description of representative embodiments thereof proceeds.

SUMMARY OF THE INVENTION

In accordance with the foregoing principles and objects of the present invention, an improved vertical junction solar cell is provided which comprises a thin silicon chip having on one surface thereof a plurality of holes therein closely spaced in a desired array, the walls of the holes defining the vertical junction of the cell. The resulting structure provides improved light utilization during the entire life of the cell, and improved radiation resistance, as compared to grooved structure cells.

DESCRIPTION OF THE DRAWINGS

The present invention will be more clearly understood from the following detailed description of representative embodiments thereof read in conjunction with the accompanying drawings wherein.

DETAILED DESCRIPTION

Figure 1:
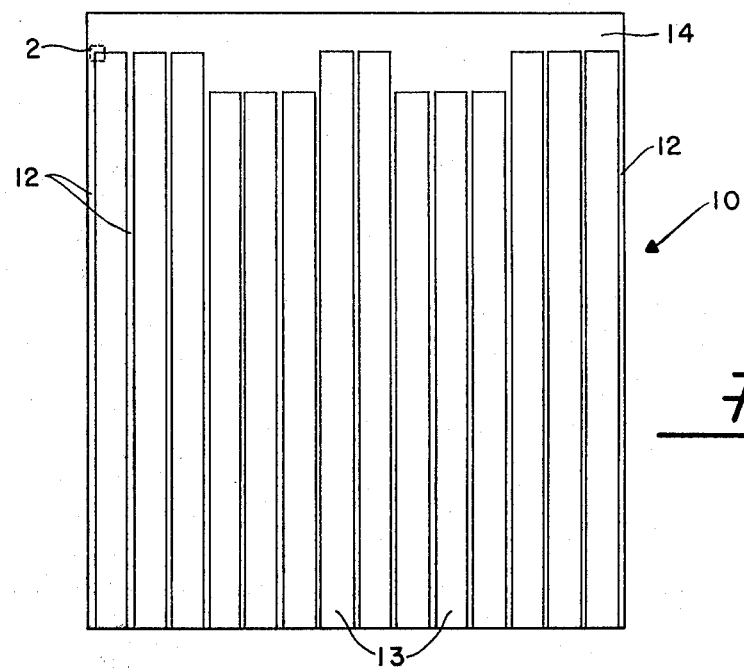
FIG. 1 is a plan view of a solar cell according to the present invention.

Referring now to the accompanying drawings, FIG. 1 is a plan view of the solar cell 10 of the present invention. The non-limiting representative configuration shown therein comprises a semiconductor substrate comprising such as a thin silicon chip about 2 cm wide, and having a plurality of holes 11 drilled into a surface of the chip. Other semiconductor materials may be selected for use herein, including multi-crystalline silicon or non-silicon based semiconductor materials, and, therefore, such material selection is not limiting hereof. The walls of the holes form the vertical junction areas of cell 10. The surface of cell 10 may be configured to include a plurality of metallic contact strips 12 defining therebetween a plurality of active areas 13 of the cell 10, each area 13 containing a plurality of holes 11 in any desirable array. Header strip 14 joins contact strips 12 to provide an electrical contact for cell 10.

Figure 2:
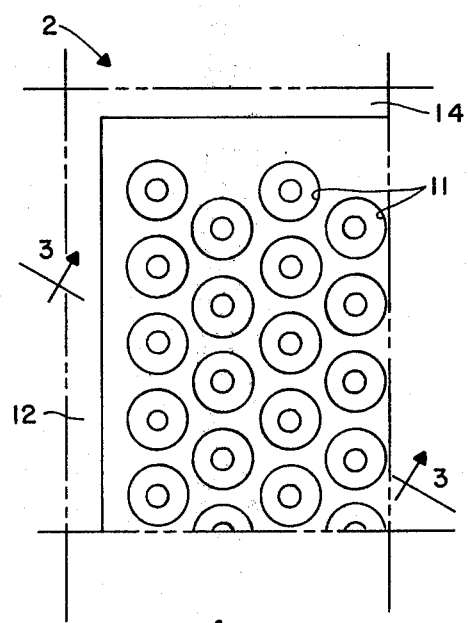
FIG. 2 is a substantially enlarged view of a portion of the solar cell of FIG. 1 showing an arrangement for the holes defining the vertical junction of the cell.
Figure 3:
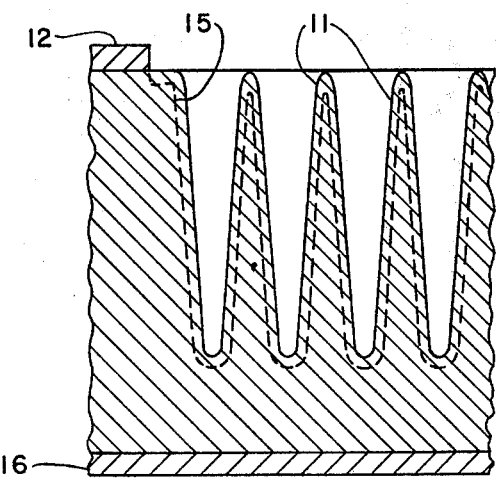
FIG. 3 is a cross-sectional view of the cell presented in FIG. 2 as viewed along line 3—3.

Referring now to FIG. 2, shown therein is a substantially enlarged view of a corner (dotted area 2 of FIG. 1) of one of the active areas 13 of cell 10. As shown therein, each active area 13 comprises a plurality of holes 11. The holes 11 may be in any desirable array, although the non-limiting hexagonal array displayed in FIG. 2 may provide optimum cell strength and maximum effective electrical conversion area. FIG. 3, which presents a cross-sectional view taken along line 3—3 of FIG. 2, shows that the holes as formed in cell 10 may exhibit a substantially conical shape.

The fabrication process for the novel solar cell 10 of the present invention may proceed substantially as follows. A P-type silicon chip of the appropriate dimensions and thickness is provided. Examples fabricated in demonstration of the invention herein, but which are not intended to be limiting of the scope hereof, comprise chips approximately 2 cm×2 cm with a thickness of about 0.005 to about 0.03 cm. Holes 11 of the desired width, depth, spacing and array are then bored into the surface to define the desired configuration of active areas 13 such as shown in FIG. 1. The size, shape, and depth of the holes 11 are not critical to the operation of the completed cell 10, although uniformity of spacing, selection of array, and control of hole diameter and depth contribute significantly to the mechanical strength, current collection efficiency, electrical conversion efficiency, and radiation resistance of the finished cell 10. Optimum cell performance may result using holes 11 of about 5 to 20 microns (one micron equals $10^{-4}$ cm) diameter at the surface of the chips, 25 to 100 microns depth, and 2 to 10 microns diameter at the bottom of the hole, and a hole spacing, in a hexagonal array, of about 7 to 30 microns. Optimum performance for a 100 micron thick cell is demonstrated with holes 11 of about 15 and 5 microns diameter, 75 microns deep, and 20 microns spacing, as shown substantially to scale in FIGS. 2 and 3. The holes 11 may be drilled or bored using any suitable process as is well known in the art, including mechanical drilling, chemical etching, laser boring, or the like. The preferred method may be by means of a pulsed laser beam photomicrograph technique.

Once holes 11 are produced over the active areas of cell 10, any surface irregularities may be removed by an acid etch. An N-type junction on the active surface areas containing holes 11 is then formed by diffusion into the chip surface of a Group V dopant material, such as phosphorus, arsenic, or the like, to the desired depth, such as represented by the dotted line labeled 15 in the cross-sectional view of FIG. 3. Nominally, the dopant material is diffused into the silicon to a depth of about 0.2 microns.

Finally, metallic electrical contacts in the desired configuration, such as current collecting strips 12 and contact strip 14, are applied, and a metallic coating 16 is applied to the bottom surface of cell 10 to provide the other electrical contact. An antireflection coating is then applied to the active surface and may comprise an oxide of silicon or tantalum, or other suitable material conventionally used for this purpose.

The present invention, as hereinabove described, therefore provides an improved vertical junction solar cell having significantly improved mechanical strength, enhanced light utilization and current collection efficiency as compared to configurations existing in the prior art. It is understood that numerous modifications to the invention as hereinabove described may be made with regard to semiconductor substrate material selection and fabrication techniques, as might occur to one with skill in the field of this invention. Therefore, all embodiments contemplated hereunder have not been described in complete detail. Other embodiments may be developed without departing from the spirit of this invention or from the scope of the appended claims.

I claim:
1. A vertical junction solar cell comprising:
   a. a semiconductor substrate of predetermined thickness having substantially parallel upper and lower surfaces;
   b. a plurality of electrically conducting strips on said upper surface and separating said upper surface into a plurality of distinct active areas, and an electrical header strip joining said conducting strips to provide a first electrical contact for said cell;
   c. a second electrical contact on said lower surface; and
   d. each of said active areas including a plurality of closely spaced holes of predetermined depth into said substrate, said holes having a substantially circular cross-section and a depth less than said substrate thickness and greater than the diameter of said holes, and being configured in a predetermined array, the walls defining said holes forming the vertical junctions of said cell.
2. The solar cell as recited in claim 1 wherein said predetermined array is hexagonal.

* * * * *